(12) United States Patent
Huang et al.

(10) Patent No.: US 7,479,461 B2
(45) Date of Patent: Jan. 20, 2009

(54) METHOD OF ETCHING SILICON ANISOTROPICALLY

(75) Inventors: Teng-Wang Huang, Dresden (DE); Kristin Schupke, Weixdorf (DE)

(73) Assignees: Infineon Technologies AG, Neubiberg (DE); Nanya Technology Corporation, Kueishan Taoyuan (TW)

(*) Notice: Subject to any disclaimer, the term of this patent is extended or adjusted under 35 U.S.C. 154(b) by 118 days.

(21) Appl. No.: 10/943,017

(22) Filed: Sep. 17, 2004

(65) Prior Publication Data

US 2005/0079714 A1    Apr. 14, 2005

(30) Foreign Application Priority Data

Sep. 24, 2003   (DE)   ............... 103 44 351

(51) Int. Cl.
*H01L 21/302* (2006.01)

(52) U.S. Cl. ............. 438/753; 438/745; 438/756; 216/99

(58) Field of Classification Search ........ 438/745, 438/750, 751, 753, 756; 252/79.1, 79; 216/83, 216/99

See application file for complete search history.

(56) References Cited

U.S. PATENT DOCUMENTS

| 4,171,242 | A | | 10/1979 | Liu | |
| 4,351,677 | A | * | 9/1982 | Mochizuki et al. | 438/545 |
| 4,795,582 | A | | 1/1989 | Ohmi et al. | |
| 5,268,069 | A | * | 12/1993 | Chapple-Sokol et al. | 216/73 |
| 5,277,835 | A | * | 1/1994 | Ohmi et al. | 252/79.3 |
| 5,496,485 | A | | 3/1996 | Maternaghan | |
| 5,716,535 | A | | 2/1998 | Lee et al. | |
| 5,779,514 | A | * | 7/1998 | Cheng et al. | 445/24 |
| 6,117,350 | A | * | 9/2000 | Yoon et al. | 216/99 |
| 6,169,038 | B1 | | 1/2001 | Kruwinus et al. | |
| 6,391,793 | B2 | | 5/2002 | Lee et al. | |
| 6,777,722 | B1 | * | 8/2004 | Yu et al. | 257/134 |

OTHER PUBLICATIONS

R. Houbertz et al., Surface Science 396, 198 (1998).

* cited by examiner

*Primary Examiner*—Lan Vinh
(74) *Attorney, Agent, or Firm*—Edell, Shapiro & Finnan, LLC

(57) ABSTRACT

A method for etching Si anisotropically uses a solution containing $NH_4F$ and HF.

3 Claims, No Drawings

METHOD OF ETCHING SILICON ANISOTROPICALLY

CROSS REFERENCE TO RELATED APPLICATIONS

This application claims priority under 35 USC §119 to German Application No. DE 103 44 351.7, filed on Sep. 24, 2003, and titled "A Method of Etching Silicon Anisotropically," the entire contents of which are hereby incorporated by reference.

FIELD OF THE INVENTION

This invention relates to a composition for etching silicon anisotropically.

BACKGROUND

In the semiconductor technology, the materials, such as silicon dioxide($SiO_2$), silicon nitride ($Si_3N_4$), polysilicon, silicon, aluminium and other materials, have to be etched in order to provide a structured substrate with can be processed further. The purpose of etching of the substrate is to remove one or more materials or to transfer the lithographic pattern into the substrate layers. The etching step should take place selectively, i.e., only one material should be etched, even though a plurality of materials may be present.

There are various methods which can be used for etching different materials, but all the etching methods can be divided in one of the two categories, namely either dry etching or wet etching processes.

In wet etching processes, the solid material is dissolved into the solution by applying an acidic or a basic solution. An etching solution can react either isotropically or anisotropically with the substrate. An isotropic etching solution etches the material in all directions, whereby an anisotropic etching solution etches a material only in one direction, namely 90 degrees to the substrate surface. There are many solutions which can be used in the semiconductor processing, which differ as to the concentration and to the composition of the materials which can be used on one side and to the materials which are to be etched on the other.

For example, for the silicon etch, there are solutions which can etch silicon isotropically and some which have preference to one of the crystal layers of the silicon crystal. Only when there is a preference for one of the layers, the anistropic etch can take place. One of the solution which can particulary be used for the silicon etch is tetra methyl ammonium hydroxide (TMAH), but this solution has very low selectivity for the different crystal layers of silicon.

In order to etch silicon anisotropically, there are several solutions which can be used. The most used solution are basic, and are, for example, KOH, NaOH, LiOH, or a mixture of ethylene diamine with other components in water (EDP-solution).

When silicon and silicon oxide are present on a substrate, and when both materials should be etched, wherein silicon is to be etched anisotropically, a two step process is usually used.

In the first step, the silicon layer is etched by solutions like KOH, $NH_4OH$, TMAH, and choline. These solutions have high silicon etch rates and high selectivity to the oxide. For example, silicon oxide is, in the instant case, not etched at all. In the second step the silicon dioxide layer is etched using HF, which is usually present in a buffered solution, together with $NH_4F$. In the semiconductor technology, there are various methods to prepare a layer of silicon dioxide. For example, the silicon dioxide layer can be prepared by thermal oxidation of silicon (thermal oxide) or by depositing silicon dioxide by using, for example, a chemical vapour deposition (CVD) process. Depending on the method of preparation of the oxide layers, these layers differ in chemical and mechanical properties. A thermal oxide can, for example, be etched with a solution containing $NH_4F/HF/H_2O$ in a relationship 2:1:7 with an etch rate of 50 nm/min., and TEOS-oxide can be etched with the same solution with a higher rate of about 150 nm/min. The solution containg $NH_4F/HF/H_2O$ is known to etch silicon oxide selective to silicon with a selectivity ratio of 100:1. This means that the silicon dioxide layer is etched 100 faster than the silicon layer.

However, the application of the chemicals in the two-step process described above is possible only in covered equipments (point of use tasks) due to an initial HF-step to remove native or thermal oxide. Furthermore, a two chemical tank sequence with a DHF, rinse, $NH_4OH$, rinse, dry shows problems regarding wettability and reaction of the forming gas ($H_2$). In the etching processes no gas should be formed, since the produced bubbles can case uneven etching of the material.

A method for etching both silicon oxide and silicon layers simultaneously, where the silicon layer is etched anisotropically, is desirable.

SUMMARY

A method for anisotropically etching silicon and silicon oxide layer(s) simultaneously, by using a solution including $NH_4F$ and HF is described. By using this buffered solution, usually called "BOE" (buffered oxide etch) or "BHF", silicon can be etched anisotropically in one immersion step before having to etch silicon oxide in a separate step. Therefore, one recirculation tank and one chemical step sequence are possible.

For instance, a conventional wet bench with a recirculation tank for the etching of silicon oxide and silicon layers can be used. The process sequence includes one chemical step followed by an overflow rinse and a dry step. The process parameters, which are known for the BOE, such as temperature, etch time, and recirculation flow, are selectable and adjustable to the process result. In comparision to these mentioned chemicals, an initial HF-step is not necessary due to wet etch behavior of BOE, which is not selective with regard to the oxide. The wetting of the Si surface can be improved by a prewet-step, which can be performed by dipping into DI water in rinse tank as a first step.

DETAILED DESCRIPTION

According to an embodiment, the composition of the BOE solution is approximately 40 weight % of $NH_4F$ and less than 0.1 weight % of HF. The rest is water.

According to this embodiment, the etch rate of silicon is approximately 5 nm/min with regard to silicon for the <100> crystal layer. The etch rates are influenced not only by the temperature at which the etching process takes place, but also by the constitution of the materials and the geometry of the substrate. For example, in deep trenches, the etch rate is 2.5 nm/min for a silicon layer, since the etching is controlled by the diffusion of the reactive species.

In another embodiment, the silicon oxide layer is a thermal oxide layer. Such layers can be prepared by treating silicon with oxygen at elevated temperatures, usually between 700 and 1200° C. The etching rate of such thermal oxide is aproximately 2 nm/min at room temperature.

The temperature at which the method of the present invention takes place is approximately between 20 and 40° C., for example. Another exemplary temperature is room temperature. However, etching is not restricted to these ranges, but can also take place at higher or lower temperatures in a particular case.

Further, components are not present in the solution according to the present invention, but, if necessary, auxiliary agents may be added, if desired. One auxiliary agent is, for example, a wetting agent, which can be added to the solution.

However, in one embodiment, the Si-surface is subject to a prewet step before etching.

The method for etching silicon and silicon oxide layers maybe used, for example, in a process for manufacturing deep trench capacitors. In this process both the silicon layers and the silicon oxide layers are etched with the same etching rate of approximately 2.5 nm/min.

Since the etching rates of silicon and oxide by BOE are approximately in the same range, there is almost no selectivity between Si- and $SiO_2$-layers.

Furthermore, the present invention provides using BOE for etching Si-layers anisotropically, even when no $SiO_2$ layers are present. The stability of the buffered system for etch rate, uniformity, and bath life time for wet oxide removal is known however, the use of BOE for anisotropic wet etch has not been disclosed until now.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

We claim:

1. A process for structuring of deep trenches, comprising:
   providing silicon dioxide and silicon layers; and
   simultaneously etching the silicon dioxide and silicon layers using a solution including $NH_4F$ and HF, wherein the silicon layer is etched anisotropically.

2. The process according to claim 1, wherein the solution includes approximately 40 weight % $NH_4F$ and less than 0.1 weight % HF.

3. A method for etching silicon and silicon oxide layers, comprising:
   etching silicon and silicon dioxide layers using a solution consisting of $NH_4F$, HF and water, wherein the silicon layer is etched anisotropically, and the etching rates of the silicon and silicon oxide layers are substantially the same.

* * * * *